US008223470B2

(12) United States Patent
Chang et al.

(10) Patent No.: US 8,223,470 B2
(45) Date of Patent: Jul. 17, 2012

(54) APPARATUS AND METHOD TO IMPROVE UNIFORMITY AND REDUCE LOCAL EFFECT OF PROCESS CHAMBER

(75) Inventors: Yu-Cheng Chang, Kaohsiung County (TW); Ying-Lin Chen, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1681 days.

(21) Appl. No.: 11/539,958

(22) Filed: Oct. 10, 2006

(65) Prior Publication Data

US 2008/0084649 A1    Apr. 10, 2008

(51) Int. Cl.
*H01T 23/00* (2006.01)
(52) U.S. Cl. ..................................... 361/234
(58) Field of Classification Search ............... 361/234
See application file for complete search history.

(56) References Cited

U.S. PATENT DOCUMENTS

| 6,028,285 | A | * | 2/2000 | Khater et al. | ............. 219/121.43 |
| 6,096,232 | A | * | 8/2000 | Hashimoto | ..................... 216/60 |
| 7,504,041 | B2 | * | 3/2009 | Chandrachood et al. | ....... 216/68 |
| 2003/0098966 | A1 | * | 5/2003 | Korenaga et al. | ............... 355/75 |
| 2004/0219737 | A1 | * | 11/2004 | Quon | ............................ 438/222 |
| 2007/0170155 | A1 | * | 7/2007 | Fink | ......................... 219/121.43 |

* cited by examiner

*Primary Examiner* — Jared Fureman
*Assistant Examiner* — Nicholas Ieva
(74) *Attorney, Agent, or Firm* — Haynes and Boone, LLP

(57) ABSTRACT

An apparatus includes a processing chamber having a plasma containing region, a dielectric plate secured on top of the processing chamber, a power source separated from the plasma containing region by the dielectric plate, and a chuck supported within the processing chamber. The chuck is operable and configured to move with respect to the power source.

15 Claims, 7 Drawing Sheets

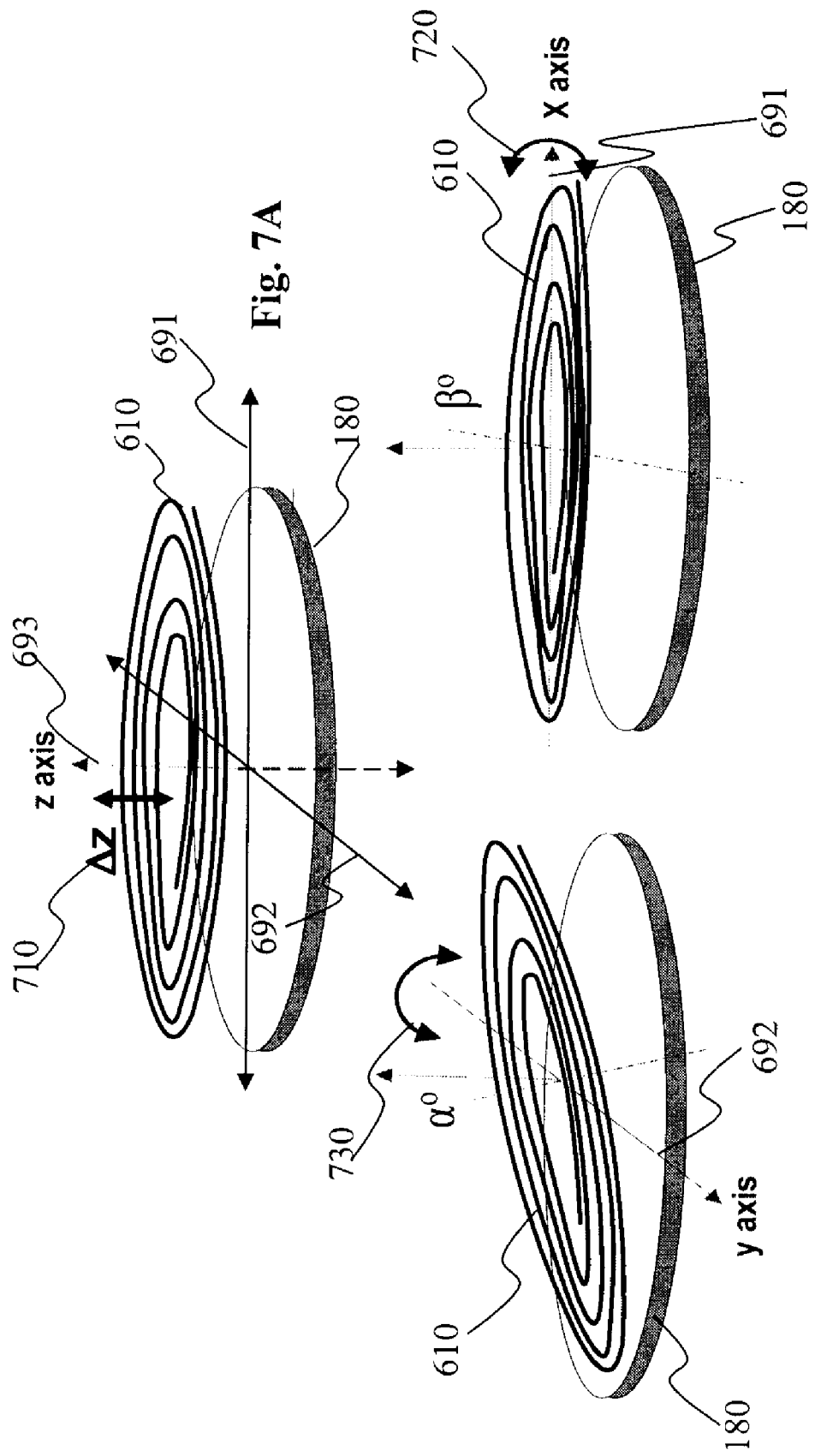

APPARATUS AND METHOD TO IMPROVE UNIFORMITY AND REDUCE LOCAL EFFECT OF PROCESS CHAMBER

BACKGROUND

The present disclosure generally relates to semiconductor manufacture, and more particularly to a plasma processing chamber that includes a dynamic chuck and coil configuration to reduce local effects of the processing chamber and improve etch uniformity across a wafer during processing.

Integrated circuit (IC) fabrication involves forming component devices such as transistors, diodes, capacitors, and resistors on a semiconductor wafer. Plasma etching is the primary method for removing material from the surface of the wafer in semiconductor manufacturing. Generally, a plasma is ignited in a processing chamber to generate highly energized ions that are accelerated toward the wafer surface by a strong electric field. These ions physically and chemically remove the unprotected wafer surface material by a bombardment-etch action. Various processing parameters, such as radio frequency (RF) power, RF bias, temperature, pressure, and flow rate are optimized to accomplish a desired etching result.

Etch uniformity measures the capability of the etching process to evenly etch across the entire surface of the wafer. Maintaining uniformity across the entire wafer surface is very important to achieve consistent manufacturing performance. However, local effects of the processing chamber such as chamber geometry and size, and coil design and placement may cause non-uniformity because the plasma density and electric field generated within the processing chamber may not be uniform across the entire wafer surface. What is needed is a simple and cost-effective apparatus and method to compensate for non-uniformity caused by local effects of the processing chamber.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

FIGS. 7A-7C are perspective views of the movement of the coil of FIG. 6.

DETAILED DESCRIPTION

Figure 1:
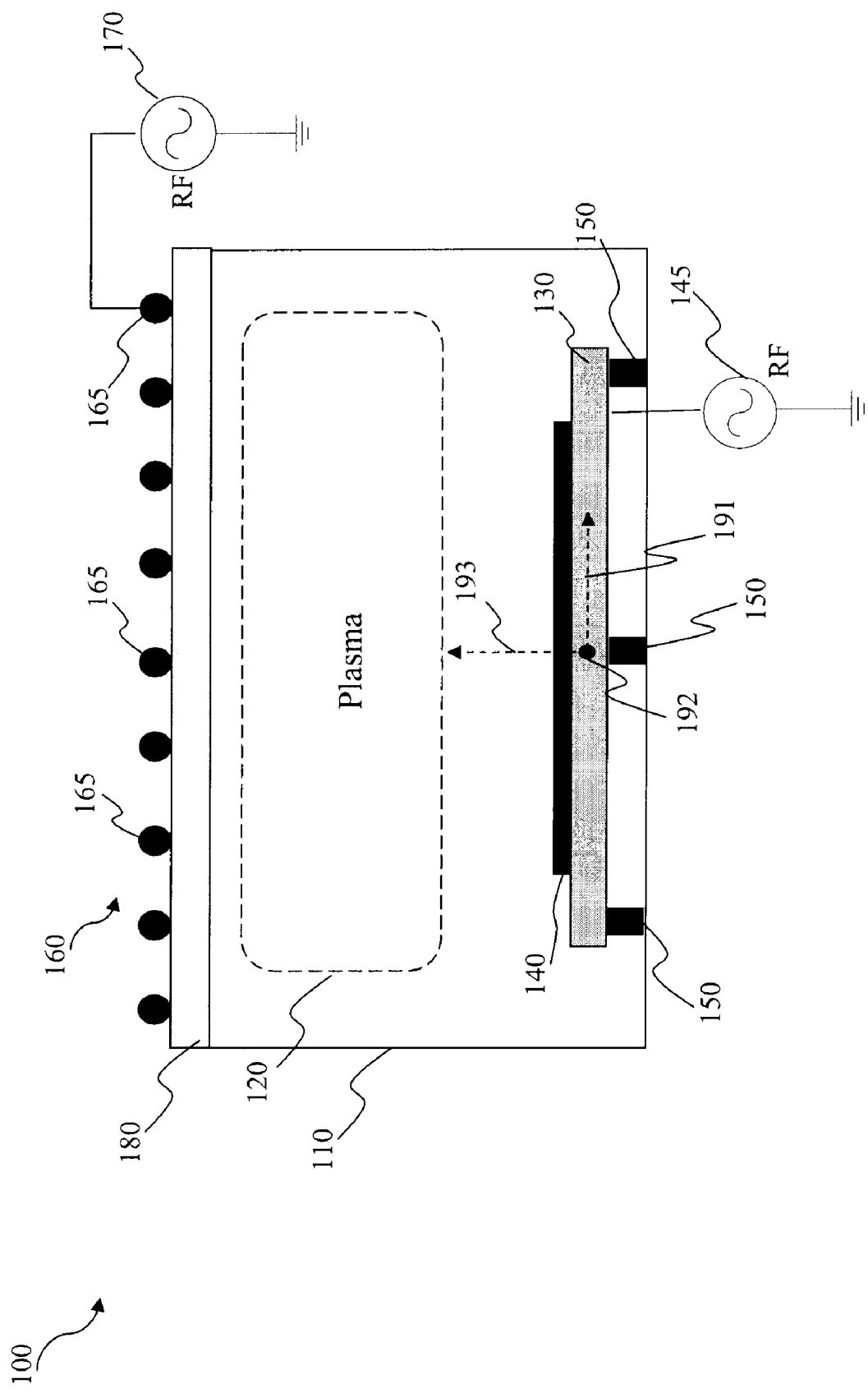
FIG. 1 is a cross-sectional view of an embodiment of a transformer-coupled plasma (TCP) reactor.

For the purpose of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, which does not by itself indicate a requirement that features of one embodiment apply to another embodiment, even if they share the same reference number.

Referring to FIG. 1, illustrated is an embodiment of a transformer-coupled plasma (TCP) reactor 100. The TCP reactor 100 includes a processing chamber 110 with a plasma containing region 120. The reactor 100 includes a chuck 130 disposed underneath the plasma containing region 120. The chuck 130 includes an electrostatic chuck (ESC) for securing a semiconductor wafer 140. The chuck 130 is coupled to a radio frequency (RF) power source 145 for biasing the wafer 140, which helps direct charged plasma radix or ions toward the wafer during processing. Alternatively, a matching network (not shown) may optionally be coupled between the chuck 130 and the RF power source 145. A plurality of micro-actuators 150 are coupled underneath the chuck 130 and positioned around a perimeter of the chuck.

The reactor 100 further includes a power source 160 located on a top portion of the processing chamber 110. The power source 160 includes a flat spiral coil 165 that is coupled to an RF power source 170. Alternatively, a matching network (not shown) may be coupled between the coil 165 and RF power source 170 for matching impedances and increasing efficiency. The flat spiral coil 165 is separated from the plasma containing region 120 by a dielectric plate 180. The dielectric plate 180 includes a quartz material or other suitable material. The reactor 100 also includes a gas supply (not shown) for providing a gas in the processing chamber 110 and a vacuum system (not shown) for maintaining an operating pressure in the processing chamber.

During operation, the semiconductor wafer 140 is secured on the electrostatic chuck 130. The wafer 140 typically includes a patterned photoresist layer that is ready for a plasma process such as a high-density plasma etching process. Initially, the chuck 130 is positioned in a plane (e.g., xy-plane) that is parallel to an x-axis 191 and y-axis 192, and perpendicular to a z-axis 193. The y-axis 192 is pointing directly out from FIG. 1. It is understood that the x-axis 191, y-axis 192, and z-axis 193 are reference axes and are only provided to aid in understanding the description that follows. The reactor 100 includes a controller for controlling various parameters such as gas flow rate, pressure, chamber temperature, power, and radio frequency to generate a plasma in the plasma containing region 120. These parameters can vary depending on the type of etching process that is required for a particular application.

The flat spiral coil 165 is energized by the RF power source 170 and generates an electric field (not shown). The electric field causes dissociation of the gas into ions, radicals, and electrons. The energized electrons are accelerated by the electric field and strike gas molecules which causes the gas molecules to be ionized (e.g., free electrons). This process continues and eventually the plasma becomes self-sustaining within the processing chamber 110. The wafer 140 is typically voltage-biased via the chuck 130 which is coupled to the RF power source 145. Accordingly, the ions contained in the plasma are directed towards the wafer 140 at a substantially right angle such that highly anisotropic etching can be achieved on the unprotected portions of the wafer.

Etch uniformity measures the capability of the etching process to evenly etch across the entire surface of the wafer 140. This is dependent on the uniformity of the plasma (e.g., plasma density) that was generated by the electric field of the coil 165 and the angle at which the ions contained in the plasma reach the wafer 140. However, local effects of the reactor 100 such as geometry and limited size of the processing chamber 110, and design and placement of the coil 165 can cause non-uniformity in certain regions of the plasma and affect the angle at which the ions reach the wafer 140. Thus, local effects of the reactor 100 usually cause non-uniform etching in the center or around the perimeter of the wafer 140. It has been observed that by adjusting a position of the wafer 140 via the chuck 130, improved etch uniformity can be achieved by compensating for local effects of the reactor 100. The adjusted position of the chuck 130 with respect to the fixed coil 165 will be based on a measured uniformity of the plasma etching process. The uniformity of the plasma etching process can be measured by a conventional optical microscope and/or scanning electron microscope.

Figures 2A, 2B:
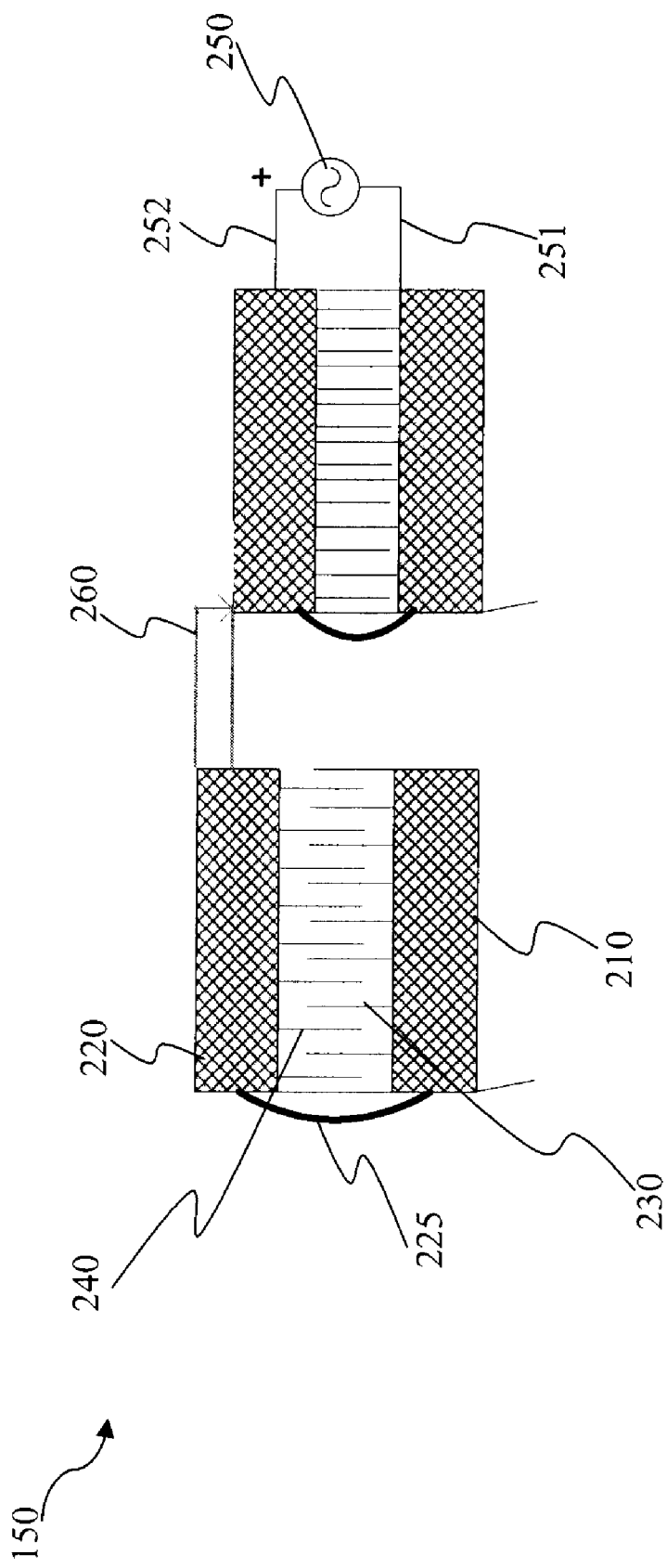
FIGS. 2A-2B are exploded cross-sectional views of the micro-actuator that is used in the TCP reactor of FIG. 1.

Referring now to FIGS. 2A-2B, illustrated are exploded cross-sectional views of the micro-actuator 150 that is used in the TCP reactor 100 of FIG. 1. In the present embodiment, the micro-actuator 150 is an electrostatic type. Other types include magnetic, hydraulic, shape memory, piezoelectric, and thermal. The micro-actuator 150 includes a stationary portion 210, a movable portion 220, and a spring 225. The micro-actuator 150 also includes a plurality of first electrodes 230 supported by the stationary portion 210 and a plurality of second electrodes 240 supported by the movable portion 220. The spring 225 supports motion of the movable portion 220 towards the stationary portion 210, and isolates the electrodes 230 to avoid reacting with the plasma. The plurality of first and second electrodes 230, 240 are configured as inter-digital fingers. The plurality of first electrodes 230 are coupled to one side (e.g., negative or ground) 251 of a power supply 250 and the plurality of second electrodes 240 are coupled to the other side (e.g., positive) 252 of the power supply 250.

During operation, when the power supply 250 supplies a voltage potential, electrostatic forces are generated between electrodes of opposite charges (polarity). Accordingly, an attractive force is generated between the plurality of first electrodes 230 and the plurality of second electrodes 240 which causes the movable portion 220 to be displaced a distance 260 toward the stationary portion 210 as shown in FIG. 2B. The amount of displacement depends on the magnitude of the voltage potential. Furthermore, the attractive force is dependent on the number of electrodes, thus, to generate a greater attractive force more electrodes can be used. The plurality of micro-actuators 150 are coupled around the perimeter of the chuck 130 (FIG. 1) via a not-illustrated spring and effecter configuration such that the spring is compressed a distance 260 by the effecter when the movable portion 220 is attracted toward the stationary portion 230.

Alternatively, the micro-actuator 150 may optionally be of a type selected from a group consisting of a magnetic micro-actuator, hydraulic micro-actuator, shape memory alloy micro-actuator, piezoelectric micro-actuator, and thermal micro-actuator. All these types of micro-actuators are well known in the art and thus, are not described in detail here.

Figure 3:
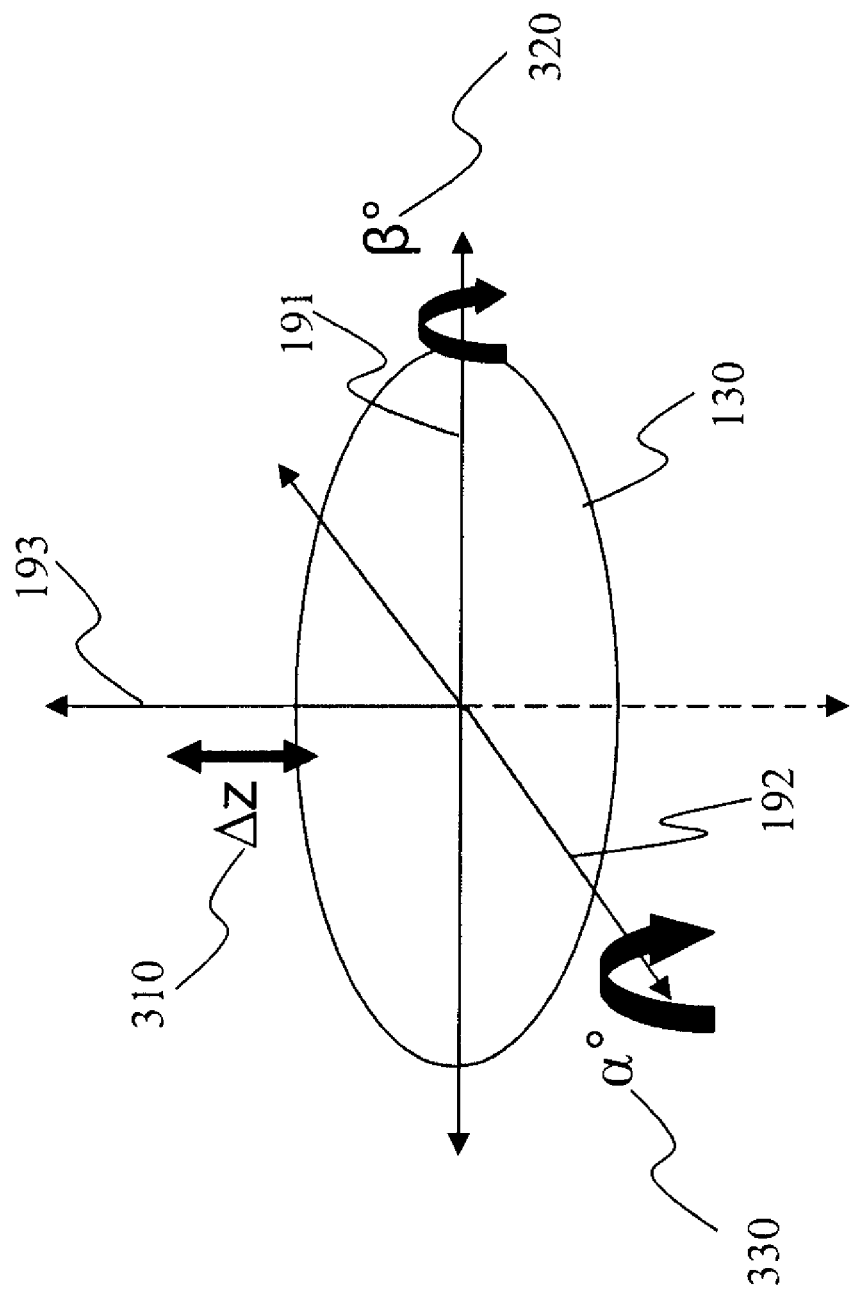
FIG. 3 is a perspective view of the movements of the chuck of FIG. 1.

Referring now to FIG. 3, illustrated is a perspective view of the movements of the chuck 130 of FIG. 1. As previously discussed, the chuck 130 initially lies in the plane (e.g., xy-plane) that is parallel to the x-axis 191 and y-axis 192, and is perpendicular to the z-axis 193. The plurality of micro-actuators 150 (FIGS. 1 and 2A-2B) are positioned around the perimeter of the chuck 130 such that each micro-actuator is capable of being displaced vertically along the z-axis 193 up to a distance ($\Delta z$) 310. For example, three micro-actuators 150 are equally spaced around the perimeter of the chuck 130. Accordingly, if all the micro-actuators 150 are displaced an equal amount, the chuck 130 is moved vertically along the z-axis 193 by that same amount. Furthermore, based on a trigonometric function, the chuck 130 can be tilted an angle $\beta°$ 320 about the x-axis 191 or can be tiled an angle $\alpha°$ 330 about the y-axis 192. Accordingly, each of the micro-actuators 150 positioned around the perimeter of the chuck 130 will be displaced a certain distance to achieve this tilting motion. Moreover, based on the trigonometric equation, the chuck 130 can also be moved in any combination (310+320+330) of the above described motion. Even though three micro-actuators 150 are used in this embodiment, it is understood that the number of micro-actuators can vary depending on the required movements of the chuck 130.

Figure 4:
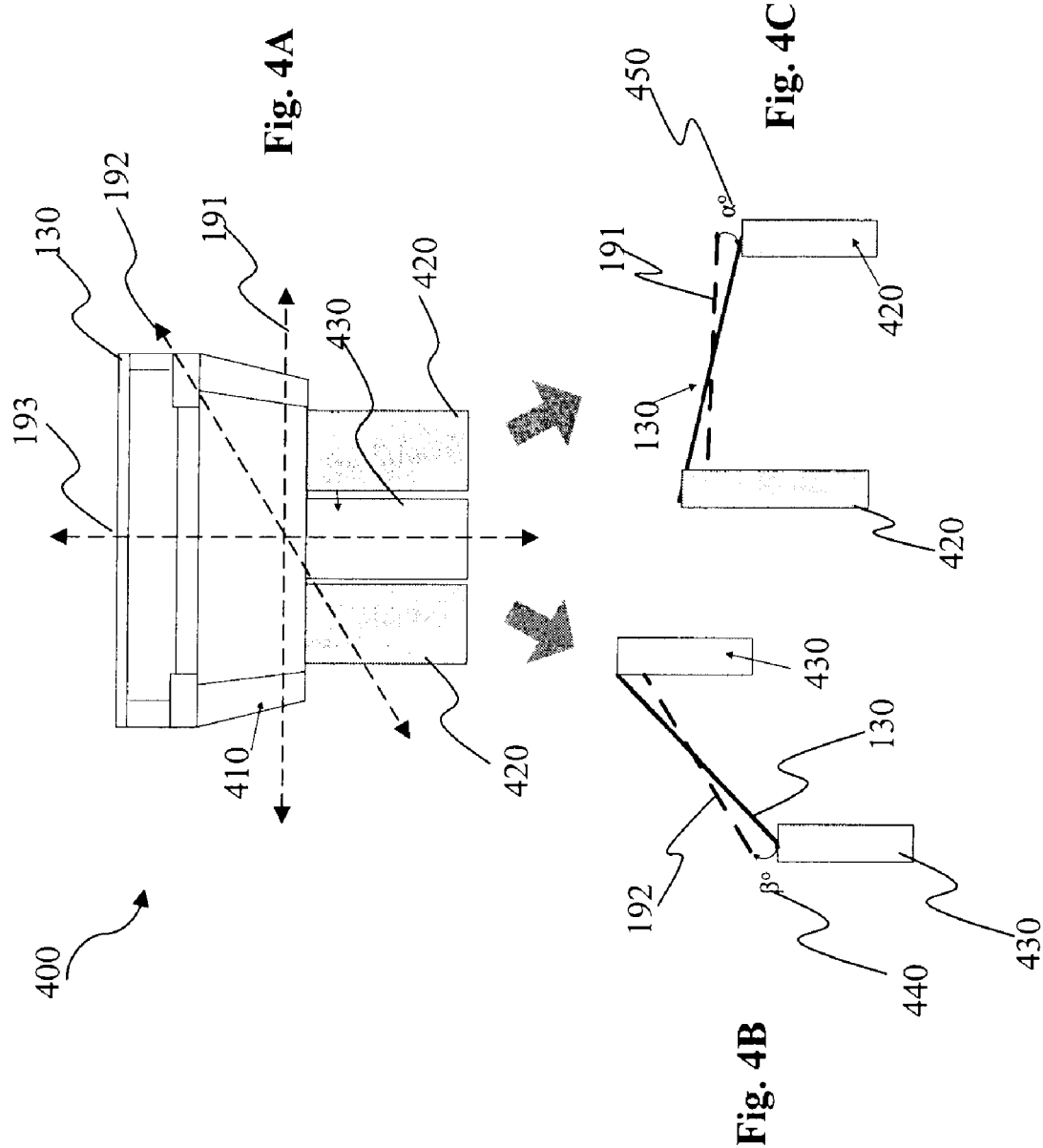
FIGS. 4A-4C are partial cross-sectional views of a set of bellows that may be used with the chuck of FIG. 1.

Referring now to FIGS. 4A-4C, illustrated are partial cross-sectional views of a set of bellows 400 that may be used with the chuck 130 of FIG. 1. As previously discussed, the chuck 130 initially lies in the plane (xy-plane) that is parallel to the x-axis 191 and y-axis 192, and is perpendicular to the z-axis 193. The chuck 130 is supported by a chuck housing 410. Two sets of bellows 420, 430 are coupled to the chuck housing 410. However, it is understood that the number of bellows may alternatively be three or more. In present embodiment, two sets (or four total bellows) are illustrated as an example. One set of bellows 420 is positioned along the x-axis 191 and the other set of bellows 430 is positioned along the y-axis 192. Each set 420, 430 includes two compressible springs that are capable of being compressed and expanded by a flow of fluid such as air. The springs are compressed and expanded along the z-axis 193. Thus, if all the springs of both sets of bellows 420, 430 are compressed or expanded an equal distance, the chuck 130 via the chuck housing 410 can be moved vertically along the z-axis 193 by that same distance. Additionally, the chuck 130 via the chuck housing 410 can be tilted an angle $\beta°$ 440 about the x-axis 191 by expanding one spring and compressing the other spring (or vice versa) of the set 430 that is positioned along the y-axis 192 as shown in FIG. 4B. The chuck 130 via the chuck housing 410 can be tilted an angle $\alpha°$ 450 about the y-axis 192 by expanding one spring and compressing the other spring (or vice versa) of the set 420 that is positioned along the x-axis 191 as shown in FIG. 4C. Moreover, the chuck 130 via the chuck housing 410 can be moved in any combination of the above described motion.

Figure 5:
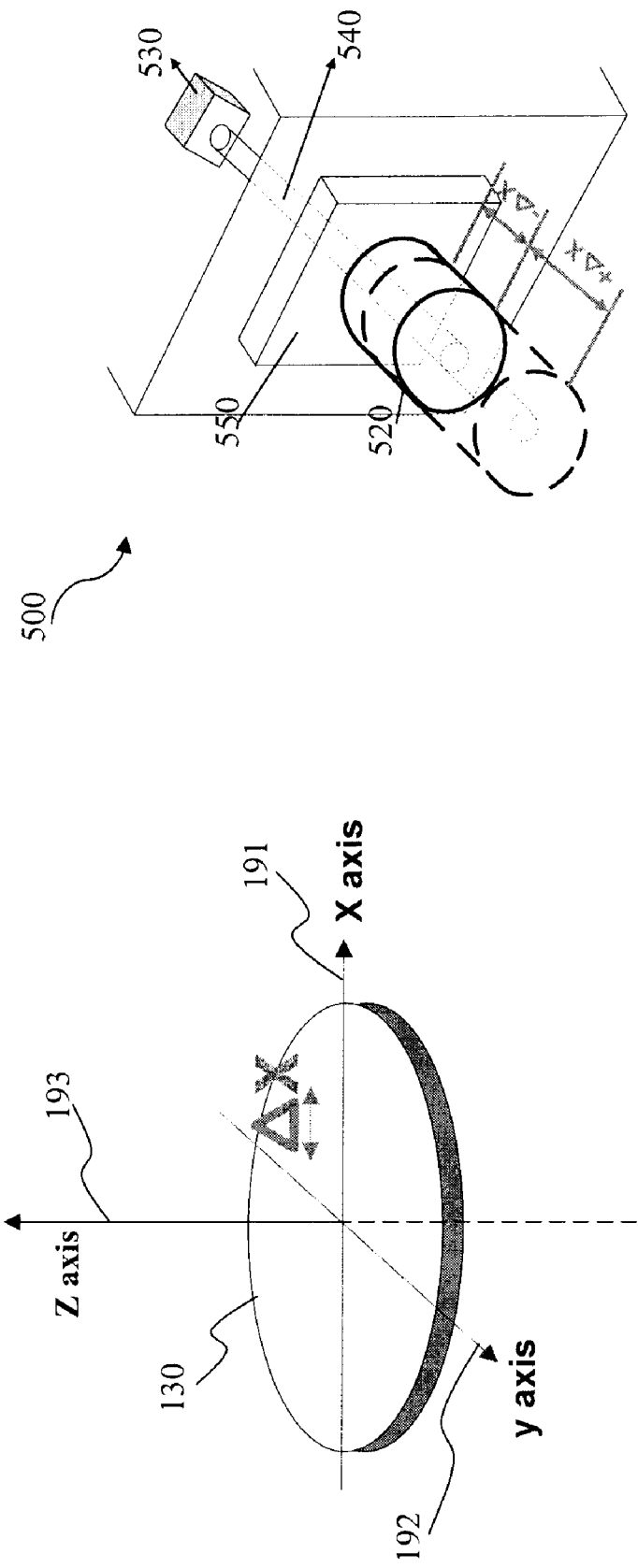
FIGS. 5A-5B are perspective views of a servo-motor that may be used with the chuck of FIG. 1.

Referring now to FIGS. 5A-5B, illustrated are perspective views of a servo-motor 500 that may be used with the chuck 130 of FIG. 1 or micro-actuator as previously described. The chuck 130 initially lies in the plane (xy-plane) that is parallel to the x-axis 191 and y-axis 192, and is perpendicular to the z-axis 193. The chuck 130 is capable of moving along the x-axis 191 as shown in FIG. 5A. The chuck 130 is coupled to a chuck housing (not shown) which is coupled to a compressible spring 520. The compressible spring 520 may be compressed and expanded along the x-axis via a link 530 that is coupled to a motor 540. The spring 520 and link 530 are supported through a neck base 550. The motor 540 is a servo motor that includes a control circuit (not shown) for controlling the amount of displacement of the link 530. Even though movement is shown along the x-axis, it is understood that the embodiment described above can be alternatively configured to provide movement along the y-axis 192 as well.

Figure 6:
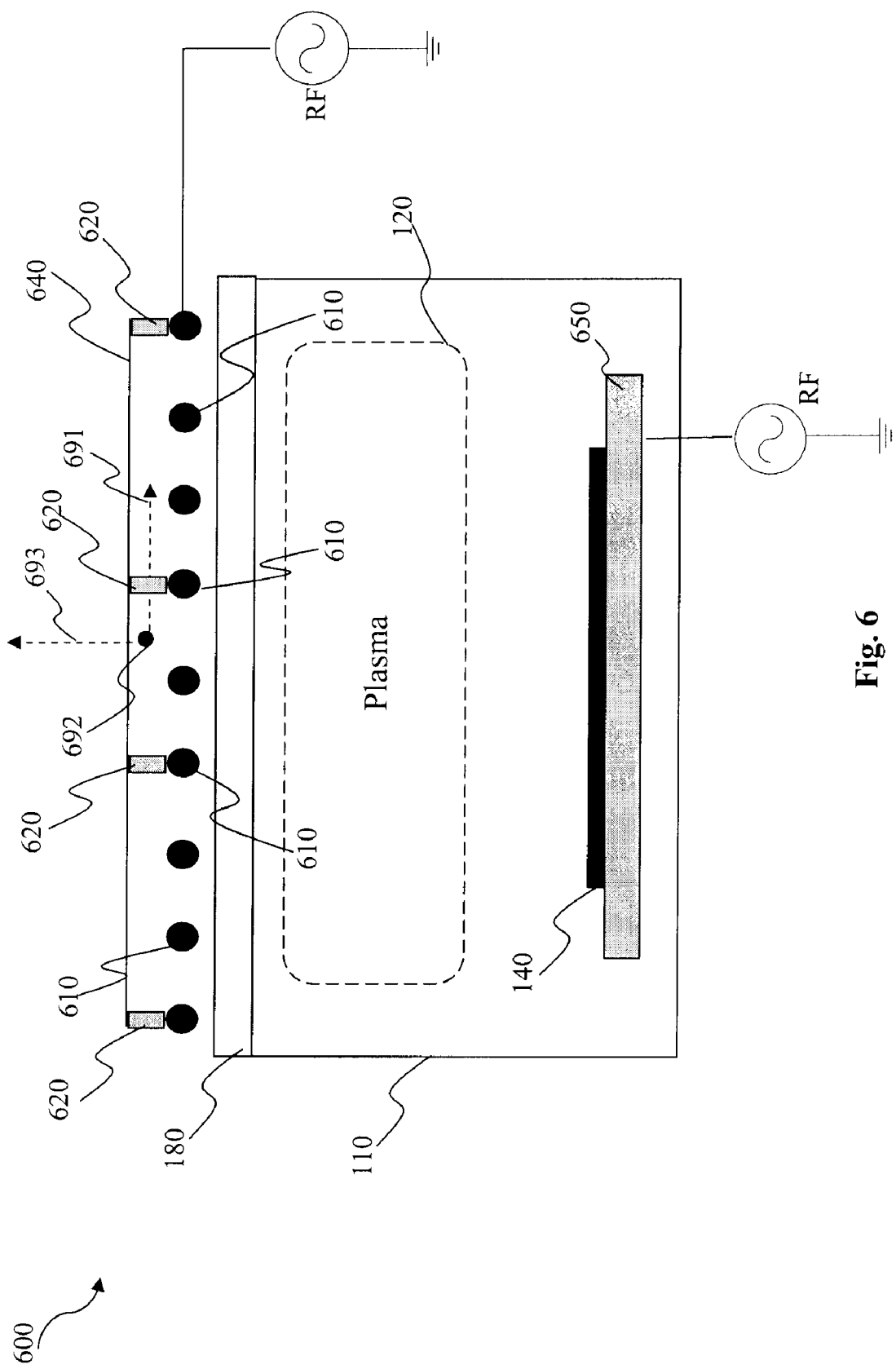
FIG. 6 is a cross-sectional view of another embodiment of a transformer-coupled plasma (TCP) reactor.

Referring now to FIG. 6, illustrated is a cross-sectional view of another embodiment of a TCP reactor 600. The reactor 600 of FIG. 6 is very similar to the reactor 100 of FIG. 1 except for some differences discussed below. For simplicity and clarity, like components between FIGS. 1 and 6 are numbered the same. The reactor 600 includes a flat spiral coil 610 that is coupled to a plurality of micro-actuators 620. The plurality of micro-actuators 620 are positioned around the perimeter and in the center of the coil 610. Even though four micro-actuators 620 are shown, it is understood that the number and arrangement of the micro-actuators can be varied depending on the design and required motion of the coil 610. The plurality of micro-actuators 620 also are coupled to a fixed portion 640. The plurality of micro-actuators 620 are the same as the micro-actuators 150 of FIG. 1. The coil 610 is separated from a plasma containing region 120 of a processing chamber 110 by a dielectric plate 180.

The reactor 600 includes an electrostatic chuck 650 for securing a semiconductor wafer 140. The chuck 650 is fixed within the processing chamber 110. The reactor 600 operates in the same manner as the reactor 100 of FIG. 1 except that the coil 610 is movable with respect to the fixed chuck 650. The plurality of micro-actuators 620 provides this motion for the coil 610. Initially, the coil 610 lies in a plane (e.g., xy-plane) that is parallel to an x-axis 691 and y-axis, and perpendicular to a z-axis 693. The y-axis 692 is pointing directly out from FIG. 6. It is understood that the x-axis 691, y-axis 692, and z-axis 693 are reference axes and are only provided to aid in understanding the description that follows.

As discussed previously, local effects of the reactor 600 usually cause non-uniform etching in the center and around the perimeter of the wafer 140. It has been observed that by adjusting a position of the coil 610 with respect to the wafer 140 that is secured on the fixed chuck 650, improved etching uniformity can be achieved by compensating for local effects of the reactor 600. The adjusted position of the coil 610 with respect to the fixed chuck 650 will be based on a measured uniformity of the plasma etching process. The uniformity of the plasma etching process can be measured by a conventional optical microscope and/or scanning electron microscope.

Referring now to FIGS. 7A-7C, illustrated are perspective views of the movements of the coil 610 of FIG. 6. As previously discussed, the coil 610 initially lies in the plane (e.g., xy-plane) that is parallel to the x-axis 691 and y-axis 692, and is perpendicular to the z-axis 693. The coil 610 also is initially parallel to the dielectric plate 180 and the chuck 650 (FIG. 6). The plurality of micro-actuators 620 (FIG. 6) are positioned around the perimeter and in the center of the coil 610 such that each micro-actuator is capable of being displaced vertically along the z-axis 693 up to a distance ($\Delta z$) 710. Accordingly, if all the micro-actuators 620 are displaced an equal amount, the coil 610 is moved vertically along the z-axis 693 by that same amount as shown in FIG. 7A. Furthermore, based on a trigonometric equation, the coil 610 can be tilted at an angle $\beta°$ 720 about the x-axis 691 as shown in FIG. 7C or can be tiled at an angle $\alpha°$ 730 about the y-axis 692 as shown in FIG. 7B. Accordingly, each of the micro-actuators 620 will be displaced a certain distance along the z-axis 693 to achieve this tilting motion. Moreover, based on the trigonometric equation, the coil 610 can also be moved in any combination (710+720+730) of the above described motion.

Thus, the present disclosure provides an apparatus comprising a processing chamber having a plasma containing region, a dielectric plate secured on top of the processing chamber, a power source separated from the plasma containing region by the dielectric plate, and a chuck supported within the processing chamber. The chuck is operable and configured to move with respect to the power source and the chuck initially lies in a plane that is parallel to an x-axis and y-axis, and perpendicular to a z-axis. In some embodiments, the chuck is configured to move along the z-axis, to tilt about the x-axis, to tilt about the y-axis, or any combination thereof.

The apparatus further comprises a plurality of micro-actuators, each micro-actuator is operable and configured to provide movement for the chuck. In other embodiments, the plurality of micro-actuators are of a type selected from a group consisting of: electrostatic, magnetic, hydraulic, shape memory alloy, piezoelectric, and thermal. In other embodiments, the apparatus further comprises a plurality of bellows, each bellow is operable and configured to provide movement for the chuck. In other embodiments, the chuck is operable and configured to move along the x-axis, to move along the y-axis, or any combination thereof. The apparatus further comprising a spring affixed to the chuck and a motor having a link coupled to the spring. The motor compresses the spring via the link to move the chuck in a linear direction. In some embodiments, the power source includes a flat spiral coil energized by an RF power source. The chuck includes an electrostatic chuck. The dielectric plate includes a quartz material or other suitable material.

The present disclosure also provides an apparatus comprising a processing chamber having a plasma containing portion, a dielectric plate secured on top of the processing chamber, a chuck supported within the processing chamber and located below the plasma containing region, and a coil separated from the plasma containing portion by the dielectric plate, wherein the coil is operable and configured to move with respect to the chuck. In some embodiments, the coil includes a flat spiral coil that is energized by an RF power source. The flat spiral coil initially lies in a plane that is parallel to an x-axis and y-axis, and perpendicular to a z-axis. The flat spiral coil is operable and configured to move along the z-axis, to tilt about the x-axis, to tilt about the y-axis, or any combination thereof.

In other embodiments, the apparatus further comprises a plurality of micro-actuators, each micro-actuator is operable and configured to provide movement for the coil. The plurality of micro-actuators are of a type selected form a group consisting of: electrostatic, magnetic, hydraulic, shape memory alloy, piezoelectric, and thermal.

The present disclosure also provides a method comprising securing a semiconductor substrate on a chuck within a processing chamber, energizing a coil to generate a plasma within the processing chamber, subjecting the semiconductor substrate to a plasma process, measuring uniformity across the subjected semiconductor substrate, and adjusting a position of the chuck with respect to the coil based on the measured uniformity. The securing includes configuring the chuck to initially lie on a plane that is parallel to an x-axis and y-axis, and perpendicular to a z-axis. The adjusting includes configuring the chuck to move along the z-axis, to tilt about the x-axis, to tilt about the y-axis, or any combination thereof.

In other embodiments, the adjusting includes configuring the chuck to move along the x-axis, to move along the y-axis, or any combination thereof. In still other embodiments, the energizing includes configuring the coil to initially lie in a plane that is parallel to an x-axis and y-axis, and perpendicular to a z-axis. The method further comprises adjusting a position of the coil with respect to the chuck based on the measured uniformity, the adjusting includes configuring the coil to move along the z-axis, to tilt about the x-axis, to tilt about the y-axis, or any combination thereof.

Although embodiments of the present disclosure have been described in detail, those skilled in the art should understand that they can make various changes, substitutions and alterations herein without departing from the spirit and scope of the present disclosure. It is understood that various different combinations of the above listed processing steps can be used in combination or in parallel. Also, features illustrated and discussed above with respect to some embodiments can be combined with features illustrated and discussed above with respect to other embodiments. Accordingly, all such modifications are intended to be included within the scope of this disclosure.

What is claimed is:

1. An apparatus comprising:
a processing chamber having a plasma containing region;
a dielectric plate secured on top of the processing chamber;
a power source separated from the plasma containing region by the dielectric plate;
a measuring device coupled to the processing chamber and operable to measure a uniformity of a plasma process carried out in the processing chamber; and
a chuck supported within the processing chamber and coupled to the measuring device, wherein the chuck is operable and configured to move with respect to the power source, and wherein the movement of the chuck is based on the uniformity measured by the measuring device.

2. The apparatus of claim 1, wherein the chuck initially lies in a plane that is parallel to an x-axis and y-axis, and perpendicular to a z-axis, wherein the chuck is operable and configured to move along the z-axis, to tilt about the x-axis, to tilt about the y-axis, or any combination thereof.

3. The apparatus of claim 2, further comprising a plurality of micro-actuators, wherein each micro-actuator is operable and configured to provide movement for the chuck.

4. The apparatus of claim 3, wherein the plurality of micro-actuators are of a type selected from a group consisting of: electrostatic, magnetic, hydraulic, shape memory alloy, piezoelectric, and thermal.

5. The apparatus of claim 2, further comprising a plurality of bellows, wherein each bellow is operable and configured to provide movement for the chuck.

6. The apparatus of claim 1, wherein the chuck initially lies in a plane that is parallel to an x-axis and y-axis, and perpendicular to a z-axis, wherein the chuck is operable and configured to move along the x-axis, to move along the y-axis, or any combination thereof.

7. The apparatus of claim 6, further comprising:
a spring affixed to the chuck; and
a motor having a link coupled to the spring, wherein the motor compresses the spring via the link to move the chuck a linear direction.

8. The apparatus of claim 1, wherein the power source includes a flat spiral coil that is energized by an RF power source.

9. The apparatus of claim 8, wherein the chuck includes an electrostatic chuck.

10. The apparatus of claim 9, wherein the dielectric plate includes a quartz material.

11. A method comprising:
securing a semiconductor substrate on a chuck within a processing chamber;
energizing a coil to generate a plasma within the processing chamber;
subjecting the semiconductor substrate to a plasma process;
measuring a uniformity of the plasma process across the subjected semiconductor substrate; and
adjusting a position of the chuck with respect to the coil based on the measured uniformity.

12. The method of claim 11, wherein the securing includes configuring the chuck to initially lie in a plane that is parallel to an x-axis and y-axis, and perpendicular to a z-axis, wherein the adjusting includes configuring the chuck to move along the z-axis, to tilt about the x-axis, to tilt about the y-axis, or any combination thereof.

13. The method of claim 11, wherein the securing includes configuring the chuck to initially lie in a plane that is parallel to an x-axis and y-axis, and perpendicular to a z-axis, wherein the adjusting includes configuring the chuck to move along the x-axis, to move along the y-axis, or any combination thereof.

14. The method of claim 11, further comprising adjusting a position of the coil with respect to the chuck based on the measured uniformity.

15. The method of claim 14, wherein the energizing includes configuring the coil to initially lie in a plane that is parallel to an x-axis and y-axis, and perpendicular to a z-axis, wherein the adjusting includes configuring the coil to move along the z-axis, to tilt about the x-axis, to tilt about the y-axis, or any combination thereof.

* * * * *